United States Patent
Min et al.

(10) Patent No.: US 9,057,755 B2
(45) Date of Patent: Jun. 16, 2015

(54) DEVICE FOR MONITORING INTERNAL ARC IN GAS INSULATED SWITCHGEAR

(71) Applicant: Hyundai Heavy Industries CO., LTD., Ulsan (KR)

(72) Inventors: Byoung Woon Min, Yongin-si (KR); Hyung Ryun Park, Ulsan (KR); Chang Sun Park, Ulsan (KR)

(73) Assignee: HYUNDAI HEAVY INDUSTRIES CO., LTD., Ulsan (KR)

( * ) Notice: Subject to any disclaimer, the term of this patent is extended or adjusted under 35 U.S.C. 154(b) by 76 days.

(21) Appl. No.: 14/019,668

(22) Filed: Sep. 6, 2013

(65) Prior Publication Data
US 2014/0062498 A1    Mar. 6, 2014

(30) Foreign Application Priority Data
Sep. 6, 2012 (KR) .................. 10-2012-0098932

(51) Int. Cl.
*G01R 31/12* (2006.01)
*H02B 13/065* (2006.01)
*H02H 1/00* (2006.01)

(52) U.S. Cl.
CPC .......... *G01R 31/1272* (2013.01); *H02H 1/0015* (2013.01); *G01R 31/1254* (2013.01); *H02B 13/065* (2013.01)

(58) Field of Classification Search
CPC ........... G01R 31/1254; G01R 31/1272; H02B 13/065; H02H 1/0015
USPC ............................ 324/536, 512, 500
See application file for complete search history.

(56) References Cited

U.S. PATENT DOCUMENTS

| | | | | |
|---|---|---|---|---|
| 6,850,399 B1 * | 2/2005 | Kato et al. | .................. | 361/93.1 |
| 2011/0309939 A1 * | 12/2011 | Glock et al. | .................. | 340/584 |
| 2014/0028324 A1 * | 1/2014 | Min et al. | .................. | 324/537 |

FOREIGN PATENT DOCUMENTS

| | | | |
|---|---|---|---|
| KR | 10-0915965 B1 | 6/2009 | |
| KR | 10-0934487 B1 | 7/2009 | |

* cited by examiner

*Primary Examiner* — Hoai-An D Nguyen
(74) *Attorney, Agent, or Firm* — Sherr & Jiang, PLLC

(57) ABSTRACT

A device for monitoring internal arc in gas insulated switchgear. The device includes: at least one or more partial discharge sensors that electronic wave signals of partial discharge generated by internal arc in a gas section of the gas insulated switchgear; at least one or more gas pressure wave sensors that measure pressure wave signals due to expansion of a gas produced by internal arc in the gas section of the gas insulated switchgear; a data acquiring unit that receives the electronic wave signals measured by the partial discharge sensors and the pressure wave signals measured by the gas pressure sensors, finds out internal arc on the basis of the received sensor measure information, and determines the reason and the position of the internal ark; and a transmitting unit that transmits the sensor measurement information and determination information from the data acquiring unit to a supersystem.

9 Claims, 1 Drawing Sheet

DEVICE FOR MONITORING INTERNAL ARC IN GAS INSULATED SWITCHGEAR

CROSS-REFERENCE TO RELATED APPLICATION

This application claims priority under 35 U.S.C. §119 to Korean Application No. 10-2012-0098932 filed on Sep. 6, 2012, which is hereby incorporated by reference in its entirety.

BACKGROUND

The present disclosure relates to a device for monitoring internal arc in a gas insulated switchgear, particularly a device for monitoring internal electric arc in a gas insulated switchgear which detects an accident (that is, an electric arc) generated in a gas insulated switchgear and accurately locates the position of fault.

In general, a gas insulated switchgear is an incoming transfer facility of which the reliability is improved by receiving a conductor and various protective devices, using an insulating gas ($SF_6$) having excellent insulating function and extinguishing function, in a metallic closed container, and has a composite structure of various components such as a breaker, a disconnector, and an earthing switch.

Korean Patent Registration No. 10-0934487 discloses a driving unit of a breaker for a gas insulated switchgear of which erosion of the driving-side chamber due to a hot gas generated in breaking of a breaker is minimized and the dielectric strength is improved, and the gas insulated switchgear includes: a driving shaft of which the inside is formed by a hollow pipe and which has a driving arc contactor at the front side, an insulating rod connected to the rear side, and a plurality of exhaust holes around the rear side; a driving-side chamber having an exhaust space for a hot gas passing through the first exhaust holes of the driving shaft and having a plurality of second exhaust holes around it; and a guide member preventing the hot gas discharged through the first exhaust holes of the driving shaft from being directly ejected to the inner side of the driving-side chamber.

Further, Korean Patent Registration No. 10-0915965 discloses a driving unit of a breaker for a gas insulated switchgear that can effectively extinguish arc generated in breaking of the breaker, prevent dielectric breakdown with the external body of the gas insulated switch gear, and be conveniently attached/detached, and the gas insulated switchgear includes: a puffer pipe having a driving part contact separately attached to the open front side and a plurality of exhaust holes around the rear side; a pipe body replaceably inserted in the front space in the puffer pipe and made of Teflon in a hollow pipe shape to guide flow of the hot gas; a pipe guide inserted in the rear space in the puffer pipe and guiding flow of the hot gas discharged through the exhaust holes; and a rod coupling end coupled to the rear side of the pipe guide for coupling to an insulating rod. According to the technology disclosed therein, it is possible to improve the breaking effect by maximizing the cooling effect of the hot gas, to prevent generation of foreign substances cause by the hot gas, to prevent dielectric breakdown due to the foreign substances, to easily perform the work for combining, to prevent generation of foreign substances due to welding, to conveniently achieve the optimum channel design with easiness of machining into an appropriate shape, and to reduce the weight, thereby reducing the weight of the entire set of driving unit.

Although the gas insulated switchgears are insulated by an extinguished gas ($SF_6$), floaters and probes due to deformation of aluminum or steel structures are produced by deterioration, such that dielectric breakdown is generated, or internal arc is generated by dielectric breakdown due to cracking of a spacer made of reinforced epoxy in some cases.

Accordingly, it was designed in the related art to detect arc generated in a gas section in the gas insulated switchgear, and find and correct the position where the arc is generated. As an existing method of detecting internal arc, there is a method of finding out whether arc is generated by generating a high-voltage impulse signal in the early stage of installing a gas insulated switchgear and a method of detecting internal arc by operating an over current ground relay that is the over current relay of a gas insulated switchgear, which is in operation.

However, according to those methods, it was possible to detect internal arc, but it was difficult to find out which factor the internal arc was caused by and where the internal arc was generated, such that it was impossible to quickly take a measure and it took waste of time and cost to find out the position of the arc.

In order to solve the problems, the internal arc was detected by a partial discharge sensor (that is, UHF sensor) or an optical fiber sensor, but it was difficult to accurately detect the internal arc even with the partial discharge sensor vulnerable to noise and the optical fiber sensor with poor sensitivity, such that malfunction of non-operation may be generated.

SUMMARY

An object of the present disclosure is to provide a device for monitoring internal arc in a gas insulated switchgear which detects internal arc generated in a gas section of a gas insulated switchgear and accurately locates the internal arc.

According to embodiments, a device for monitoring internal arc of a gas insulated switchgear includes: at least one or more partial discharge sensors that electronic wave signals of partial discharge generated by internal arc in a gas section of the gas insulated switchgear; at least one or more gas pressure wave sensors that measure pressure wave signals due to expansion of a gas produced by internal arc in the gas section of the gas insulated switchgear; a data acquiring unit that receives the electronic wave signals measured by the partial discharge sensors and the pressure wave signals measured by the gas pressure sensors, finds out internal arc on the basis of the received sensor measure information, and determines the reason and the position of the internal ark; and a transmitting unit that transmits the sensor measurement information and determination information from the data acquiring unit to a super-system.

In an embodiment, the gas pressure wave sensors may directly measure gas pressure waves generated by expansion pressure of a gas produced by the internal arc.

In an embodiment, the data acquiring unit may find out noise and internal arc, using the pressure wave signals from the gas pressure wave sensors.

In an embodiment, the data acquiring unit may analyze the reason of the internal arc by analyzing a partial discharge pattern from the electronic wave signals from the partial discharge sensors.

In an embodiment, the data acquiring unit may estimate the position of the internal arc by analyzing electronic wave attenuation characteristics in the gas section of the gas insulated switchgear, using the electronic wave signals from the partial discharge sensors, and simultaneously measuring the traveling speed of the pressure wave and analyzing the traveling speed, using the pressure wave signals from the gas pressure wave sensors.

In accordance with an embodiment, the at least one partial discharge sensor may include: a first partial discharge sensor configured to monitor two adjacent gas sections of the gas insulated switchgear; and a second partial discharge sensor configured to monitor another two adjacent gas sections of the gas insulated switchgear.

In accordance with an embodiment, the least one gas pressure wave sensor may include: a first gas pressure wave sensor configured to monitor a first gas section; a second gas pressure wave sensor configured to monitor a second gas section adjacent to the first gas section; a third gas pressure wave sensor configured to monitor a third gas section; and a fourth gas pressure wave sensor configured to monitor a fourth gas section adjacent to the third gas section.

In accordance with an embodiment, the at least one partial discharge sensor may include: a first partial discharge sensor configured to monitor the first and second gas sections; and a second partial discharge sensor configured to monitor the third and fourth gas sections.

In accordance with an embodiment, the second and third gas sections may be adjacent to each other.

A device for monitoring internal arc of a gas insulated switchgear according to an embodiment of the present invention can quickly take a measure against internal arc, by detect and locate an accident (that is, arc) generated in a gas section of a gas insulated switchgear by combining a partial discharge sensor with a gas pressure wave sensor, such that it is possible to minimize manpower and cost for maintenance.

The above references are incorporated by reference herein where appropriate for appropriate teachings of additional or alternative details, features and/or technical background.

BRIEF DESCRIPTION OF THE DRAWINGS

The embodiments will be described in detail with reference to the following drawings in which like reference numerals refer to like elements wherein.

DETAILED DESCRIPTION

Figure 1:
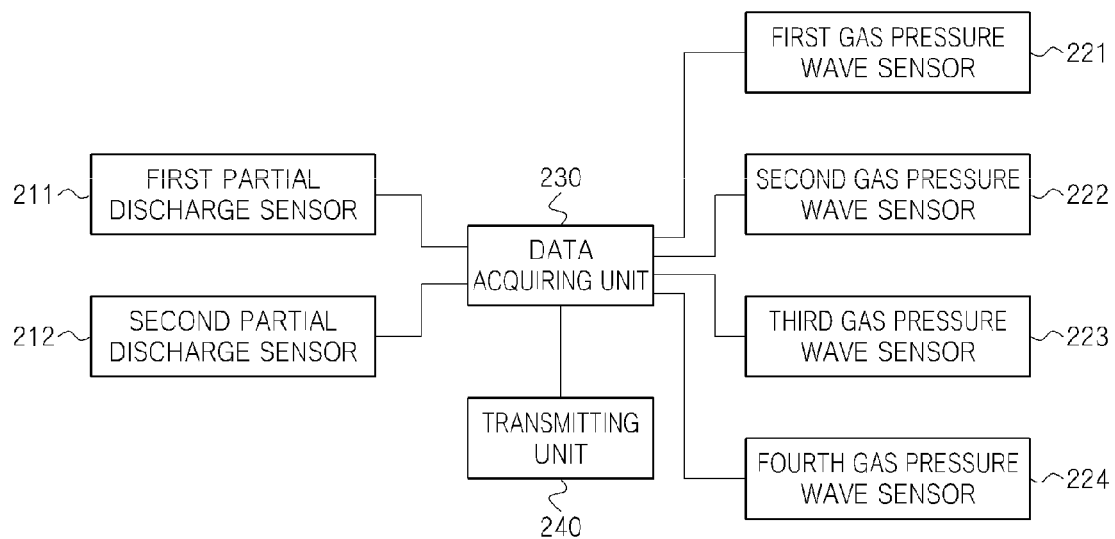
FIG. 1 is a block diagram illustrating a device for monitoring internal arc in a gas insulated switchgear according to an embodiment of the present disclosure.

Hereinafter, the present disclosure will be described more fully with reference to the accompanying drawings, in which exemplary embodiments of the disclosure are illustrated. However, as those skilled in the art would realize, the described embodiments may be modified in various different ways, all without departing from the spirit or scope of the present disclosure. In the accompanying drawings, portions unrelated to the description will be omitted in order to obviously describe the present disclosure, and similar reference numerals will be used to describe similar portions throughout the present specification.

FIG. 1 is a block diagram illustrating a device for monitoring internal electric arc in a gas insulated switchgear according to an embodiment of the present disclosure.

Referring to FIG. 1, a device for monitoring internal arc in a gas insulated switchgear includes at least one or more partial discharge sensors 211 and 212, at least one or more gas pressure wave sensors 221, 222, and 223, 224, a data acquiring unit 230, and a transmitting unit 240, and detects and locates internal electric arc generated in any one of a plurality of gas sections 110 (111, 112, 113, and 114) of a gas insulated switchgear 100.

The partial discharge sensors 211 and 212 measure an electronic wave signal of partial discharge generated by internal electric arc, when the internal electric arc is generated in the gas sections 110 of the gas insulated switchgear 100, and transmit the measured electronic wave signal (that is, partial discharge sensor measurement information) to the data acquiring unit 230. Further, the partial discharge sensors 211 and 212 have high sensitivity and can monitor a wide area.

The gas pressure wave sensors 221, 222, 223, and 224 measure a pressure wave signal due to expansion of a gas produced by internal electric arc, when the internal electric arc is generated in the gas sections 110 of the gas insulated switchgear 100, and transmit the measured pressure wave signal (that is, gas pressure wave sensor measurement information) to the data acquiring unit 230. Further, the gas pressure wave sensors 221, 222, 223, and 224 make it possible to reduce noise due to the partial discharge, by directly measuring the gas pressure wave generated by the expansion pressure of the gas produced by the internal electric arc, and make it possible to detect the position of the internal electric arc by calculating the traveling speed of the gas pressure wave.

The data acquiring unit 230 receives the partial discharge sensor measurement information from the partial discharge sensors 211 and 212 and the gas pressure wave sensor measurement information from the gas pressure wave sensors 221, 222, 223, and 224, and finds out the internal electric arc and determines the generation reason and position from the received sensor measurement information.

In other words, the data acquiring unit 230 receives the pressure wave signals from the gas pressure wave sensors 221, 222, 223, and 224 and finds out noise (that is, partial discharge and disturbance signal) and the internal electric arc, using the received pressure wave signals.

Further, the data acquiring unit 230, when it is determined as internal electric arc, receives the electronic wave signals from the partial discharge sensors 211 and 212, analyzes the reason of the internal part by analyzing the partial discharge patterns from the received electronic wave signals, and transmits the information on the analyzed reason of the internal electric arc to the transmitting unit 240.

Further, the data acquiring unit 230 estimates the position of the internal electric arc by analyzing electronic wave attenuation characteristics in the gas sections 110 of the gas insulated switchgear 100, using the electronic wave signals from the partial discharge sensors 211 and 212, and simultaneously measuring the traveling speed of the pressure wave and analyzing the traveling speed, using the pressure wave signals from the gas pressure wave sensors 221, 222, 223, and 224, and transmits the information on the estimated position of the internal electric arc to the transmitting unit 240.

Further, the data acquiring unit 230 transmits the information on the electronic wave signals from the discharge partial sensors 211 and 212 and the pressure wave signals from the gas pressure wave sensors 221, 222, 223, 224 (that is, sensor measurement information) too, to the transmitting unit 240.

The transmitting unit 240 transmits the sensor measurement information and determination information to a super-system that displays the information to a user. The transmitting unit 240 receives the information on the reason of the internal electric arc analyzed by the data acquiring unit 230 and the information on the position of the internal electric arc, and then processes the received determination information on the reason and the position of the internal electric arc into transmission data and transmits the data to the super-system.

Further, the transmitting unit 240 receives measurement information on the electronic wave signals and the pressure wave signals from the data acquiring unit 230, and then processes the received measurement information on the electronic wave signals and the pressure wave signals into transmission data too and transmits the data to the super-system.

Figure 2:
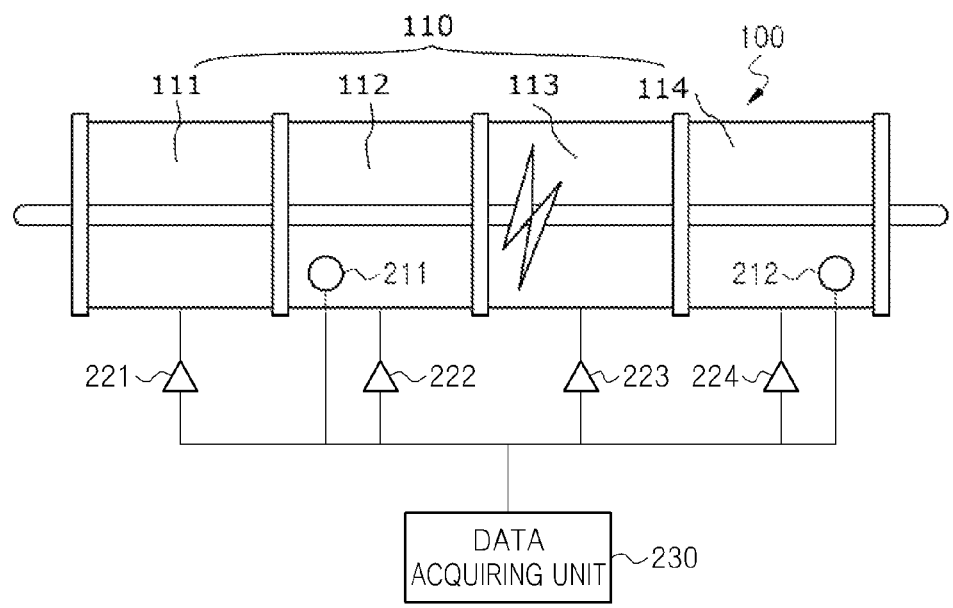
FIG. 2 is a diagram illustrating an example of installing the partial discharge sensor and the gas pressure wave sensor illustrated in FIG. 1.

FIG. 2 is a diagram illustrating an example of installing the partial discharge sensor and the gas pressure wave sensor illustrated in FIG. 1.

As illustrated in FIG. 2, a plurality of partial discharge sensors 211 and 212 and a plurality of gas pressure wave sensors 221, 222, 223, 224 are disposed in the gas sections 110 of the gas insulated switchgear 100. Since the partial discharge sensors 211 and 212 have high sensitivity and can monitor a wide area, each partial discharge sensor is disposed to monitor two adjacent gas sections. For example, the partial discharge sensor 211 is installed to monitor the two adjacent gas sections 111 and 112, and another partial discharge sensor 212 is installed to monitor another two adjacent gas sections 113 and 114. The gas pressure wave sensors 221, 222, 223, 224 may be disposed in the gas sections 111, 112, 113, 114, respectively, to more accurately find out internal electric arc, as illustrated in FIG. 2.

The operation of the device for monitoring internal electric arc in a gas insulated switchgear according to an embodiment of the present disclosure is described in more detail hereafter.

The internal electric arc generated in the gas sections 110 of the gas insulated switchgear 100 is usually caused by unexpected foreign substances in early installation of the gas insulated switchgear 100 and by deterioration of insulating performance due to aging of the gas insulated switchgear 100.

Accordingly, it is required to find out the position of a problem and then correct the problem by performing a test for finding out whether internal electric arc was generated, by generating high-voltage impulse signal in early installation of the gas insulated switchgear 100, and it is required to keep monitoring because the internal electric arc due to aging of the gas insulated switchgear 100 may cause an earth fault.

The device for monitoring internal electric arc in a gas insulated switchgear according to an embodiment of the present disclosure detects internal electric arc in early installation of the gas insulated switchgear 100 and internal electric arc due to aging and accurately locate the internal electric arc, in which the device detects and locates the internal electric arc by combining the measurement information from the partial discharge sensors 211 and 212 and the measurement information from the gas pressure wave sensors 221, 222, 223, 224.

First, when an electric arc is generated in the gas sections 110 of the gas insulated switchgear 100, the partial discharge sensors 211 and 212 in the gas sections 110 of the gas insulated switchgears 100 measure electronic wave signals corresponding to partial discharge generated when the internal electric arc is generated and transmit the measured electronic wave signals to the data acquiring unit 230.

The partial discharge sensors 211 and 212 measure partial discharge such as partial surface discharge due to a high electric field on the surface of insulators in the gas sections 110 or internal discharge generated in holes or bubbles in the insulators.

Further, the gas pressure wave sensors 221, 222, 223, 224 in the gas sections 110 of the gas insulated switchgear 100 directly measure gas pressure waves due to expansion pressure of a gas produced by the internal electric arc and transmit pressure wave signals of the measure gas to the data acquiring unit 230.

Accordingly, the data acquiring unit 230 receives the pressure wave signals of the gas from the gas pressure wave sensors 221, 222, 223, 224 and finds out noise (that is, partial discharge and disturbance signal) and the internal electric arc, using the received pressure wave signals. That is, the data acquiring unit 230 can find out the internal electric arc by comparing the information on the pressure wave signal from the gas pressure wave sensors 221, 222, 223, 224 with the information on a reference pressure wave signal set in advance in an internal memory.

After finding out the internal electric arc, the data acquiring unit 230 receives the electronic wave signals from the partial discharge sensors 211 and 212, analyzes the reason of the internal part by analyzing the partial discharge patterns from the received electronic wave signals, and transmits the information on the analyzed reason of the internal electric arc to the transmitting unit 240. That is, the data acquiring unit 230 can check the information on the reason of the internal electric arc corresponding to partial discharge patterns set in advance in the internal memory, on the basis of the partial discharge patterns analyzed on the basis of the electronic wave signals from the partial discharge sensors 211 and 212, and then transmit the checked information on the internal electric arc to the transmitting unit 240.

Further, the data acquiring unit 230 estimates the position of the internal electric arc by analyzing electronic wave attenuation characteristics in the gas section 110 of the gas insulated switchgear 100, using the electronic wave signals from the partial discharge sensors 211 and 212, and simultaneously measuring the traveling speed of the pressure wave and analyzing the traveling speed, using the pressure wave signals from the gas pressure wave sensors 221, 222, 223, 224, and transmits the information on the estimated position of the internal electric arc to the transmitting unit 240.

The data acquiring unit 230 can estimate the position of the internal electric arc on the basis of the electronic wave signal attenuation characteristics analyzed for each of the gas sections 110 of the gas insulated switchgear 100 and the traveling speed of the pressure waves. For example, the data acquiring unit 230 can estimate the position of the internal electric arc by checking the gas sections 110 where the electronic wave signals are attenuated and the traveling speed of the pressure wave signals changes.

Further, the data acquiring unit 230 transmits the information on the electronic wave signals from the discharge partial sensors 211 and 212 and the pressure wave signals from the gas pressure wave sensors 221, 222, 223, 224 too, to the transmitting unit 240, together with the information on the reason and the position of the internal electric arc.

Then, the transmitting unit 230 receives the information on the analyzed reason of the internal electric arc and the information on the estimated position of the internal electric arc from the data acquiring unit 230, receives the measurement information on the electronic wave signals and the pressure wave signals, and then processes the determination information on the received reason and position of the internal electric arc into transmission data, together with the measurement information on the received electronic wave signals and pressure wave signals, and transmits the data to a super-system. Then the super-system receives the sensor measurement information and the determination information from the transmitting unit 240 and can display the information to a user.

As described above, the device for monitoring internal electric arc of a gas insulated switchgear according to an embodiment of the present disclosure, uses partial discharge sensors and gas pressure wave sensors to detect arc generated in a gas section of the gas insulated switchgear, in which the device can more accurately detect and locate internal arc by combining two sensors, such that it can quickly take a measure against the internal arc by the accuracy of detection and location of the internal arc, and accordingly, it is possible to minimize the manpower and cost for maintenance.

Although the present disclosure was described above with reference to exemplary embodiments, it should be understood that the present disclosure may be changed and modified in various ways by those skilled in the art, without departing from the spirit and scope of the present disclosure described in claims.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A device for monitoring internal electric arc of, the device comprising:
    a plurality of first and second sensors disposed at portions of a plurality of gas sections;
    at least one first sensor configured to measure electronic wave signals of discharge generated by the internal electric arc in any one of the gas sections;
    at least one second sensor disposed at a portion of a plurality of gas section, the second sensor configured to measure pressure wave signals generated by an expansion of gas occurred by the discharge of the internal electric arc;
    a data acquiring unit configured to receive both of the electronic wave signals and pressure wave signals generated corresponding from the at least one of the first sensor and the second sensor, the data acquiring unit further configured to determine a location of the internal arc discharged at any location of the plurality of gas sections, the location being determined by simultaneously analyzing electric wave signal attenuation characteristics detected by the at least one first sensor and changes of traveling speed of pressure waves detected by the at least one second sensor; and
    a transmitting unit configured to transmit information determined by the data acquiring unit to a super-system.

2. The device according to claim 1, wherein the at least one first sensor comprises a partial discharge sensor and the at least one second sensor comprises a gas pressure wave sensor which configured to directly measure gas pressure waves generated by an expansion pressure of the gas occurred by the internal electric arc.

3. The device according to claim 1, wherein the data acquiring unit is configured to distinguishably determine noises from the internal electric arc by analyzing the pressure wave signals received from the at least one second sensor.

4. The device according to claim 1, wherein the data acquiring unit is configured to determine the reason of an occurrence of the internal electric arc by analyzing a partial discharge pattern from the electronic wave signals received from the at least one first sensor.

5. The device according to claim 1, wherein the data acquiring unit is configured to determine a generating position of the internal electric arc from a plurality of positions of the plurality of gas sections by analyzing electronic wave attenuation characteristics by simultaneously analyzing both of the electronic wave signals received from the at least one first sensor and the changes of traveling speed of pressure waves.

6. The device of claim 1, wherein the at least one first sensor is disposed in every other gas section of the plurality of gas sections and
    is configured to monitor a gas insulated switchgear of two adjacent gas sections of the plurality of gas sections.

7. The device of claim 1, wherein the least one second sensor is disposed in every gas section of the plurality of gas sections and is configured to monitor each section of the plurality of gas sections.

8. The device of claim 6, wherein the at least one first sensor includes a first partial discharge sensor configured to monitor first and second gas sections of the plurality of gas sections; and a second partial discharge sensor configured to monitor third and fourth gas sections of the plurality of gas sections.

9. The device of claim 8, wherein the second and third gas sections are adjacent to each other.

* * * * *